United States Patent [19]
Spitko

[11] Patent Number: 6,026,884
[45] Date of Patent: Feb. 22, 2000

[54] LAMINATING DEVICE

[75] Inventor: Carl W. Spitko, Rydal, Pa.

[73] Assignee: Maintech, Inc., Huntingdon Valley, Pa.

[21] Appl. No.: 09/013,832

[22] Filed: Jan. 27, 1998

[51] Int. Cl.[7] .................................................. B32B 31/00
[52] U.S. Cl. ..................... 156/555; 156/582; 156/583.1; 100/334
[58] Field of Search ................................. 156/555, 580, 156/582, 583.1, 358, 359, 363, 364; 100/327, 334, 155 R, 160, 176

[56] References Cited

U.S. PATENT DOCUMENTS

| 3,767,510 | 10/1973 | Gustafson | 156/494 |
|---|---|---|---|
| 3,802,974 | 4/1974 | Emmel | 156/55 |
| 4,387,000 | 6/1983 | Tancredi | 156/495 |
| 4,743,334 | 5/1988 | Singer | 156/499 |
| 4,865,675 | 9/1989 | Yamamoto et al. | 156/164 |
| 5,019,203 | 5/1991 | Singer | 156/309.9 |
| 5,139,600 | 8/1992 | Singer | 156/301 |

*Primary Examiner*—James Sells
*Attorney, Agent, or Firm*—Stuart E. Beck, Esq.

[57] ABSTRACT

A laminating device for manufacturing a laminated printed circuit board comprising a frame that supports sets of heated rollers along the path of movement of said laminated circuit boards while they are being manufactured. Each of said sets of rollers including two rollers. The rollers on one side of the path of travel of the printed circuit board blank are driven to move the blank through the device. The rollers are heated, and means are provided for selectively moving the rollers in each of said sets of rollers toward and away from each other to apply pressure to said printed circuit board blank.

4 Claims, 2 Drawing Sheets

LAMINATING DEVICE

FIELD OF THE INVENTION

This invention relates to a laminating device and more particularly, to a laminating device that is useful in the manufacture of printed circuit board blanks.

BACKGROUND OF THE INVENTION

A printed circuit board blank is a laminate that comprises a layer of electrically conductive material such as a copper plate or the like and a layer of photographically light sensitive material such as an ultra-violet sensitive film which is commonly referred to as "dry film resist" on a core of material which typically is comprised of fiberglass resin mesh.

Typically, the printed circuit board blank may be square or rectangular. However, it can be any suitable shape.

The layer of photographically light-sensitive material is laminated to the layer of electrically conductive material in a suitable laminating machine. Typically, the laminating machine brings the layer of photographically light-sensitive material into touching relation with the surface of the copper plate to form an assembly. Then, heat and pressure are applied by conveying the assembly through a set of opposed rollers. The rollers apply heat and pressure to the layer of photographically light-sensitive material and the layer of electrically conductive material so that the layer of photographically light-sensitive material is bonded to the layer of electrically conductive material to form the laminated printed circuit board blank.

Typically, the rollers in each set of rollers are movable toward and away from each other. This is so that when, for example, the layer of electrically conductive material is a copper plate, its leading edge and/or trailing edges which may be rough or unfinished do not damage the surface of the rollers. Thus, damage is avoided by not bringing the rollers in each set together until the leading edge of the copper plate is between them and then retaining them together until just as the trailing edge is exiting.

In this regard, each of the rollers may be comprised of heavy duty solid stainless steel. The rollers may be coated with rubber or other suitable material having a durometer hardness of about 70 on the Shore A scale. While for many applications 70 on the Shore A scale is satisfactory, is it is apparent that the hardness of the roller surface or the scale by which it is measured do not form part of the invention, but are included to provide a more complete description of the prior art.

After the layer of photographically light-sensitive material is laminated to the layer of electrically conductive material to form the printed circuit board blank, the circuit which is to be formed on the printed circuit board blank is optically projected onto the layer of photographically light-sensitive material in a manner similar that used in a conventional still camera where the image is projected onto the light sensitive film.

However, in contrast to a conventional camera the film used in the manufacture of printed circuit boards is sensitive to ultra-violet light rather then visible light. This enables it be handled in a factory environment with out fear of inadvertently exposing it. The exposed photographically light sensitive material is removed when the photographically light sensitive material is "developed" leaving the desired portions of the surface of the copper plate exposed. The desired circuit is then etched into the layer of electrically conductive material in the places where the photographically light sensitive material has been removed.

It is essential in the manufacture of the printed circuit board blanks that there be a complete bond between the photographically light sensitive material and the surface of the electrically conductive material. If the photographically light sensitive material is not completely bonded to the surface of the electrically conductive material, the circuit which is projected onto the photographically light sensitive material may not be in sharp focus resulting in a distorted circuit being etched into the electrically conductive material. Further, during etching, the etching fluid can flow under the layer of photographically light sensitive material if it is not bonded to the surface of the electrically conductive material which could result in other inaccuracies, short circuits or the like.

Even when great care and attention is paid to the manufacturing process, a substantial portion of printed circuit board blanks are defective as a result of incomplete lamination of the photographically light sensitive material and electrically conductive material. Typically, the defects include air bubbles, scratches or other surface defects which prevent the layer of photographically light sensitive material from completely bonding to the surface of the electrically conductive material, or the bond fails to occur at the edges of the electrically conductive material.

This may result from a defect in the laminating process, an unevenness in the surface of the electrically conductive material on which the bond is to be made, unevenness in the photographically light sensitive material, or the like.

Consequently, up to forty percent of printed circuit board blanks are unusable.

SUMMARY OF THE INVENTION

With the foregoing in mind, the invention relates generally to an improvement in a device for manufacturing a printed circuit board blank or other laminate of the type that has means for receiving a layer of electrically conductive material into which the printed circuit is to be etched and a layer of photographically light-sensitive material which is to be laminated to it. The improvement comprises a frame supporting a plurality of sets of heated rollers. The rollers in each set are disposed along the path of movement of the circuit board blank. Each of the sets of rollers includes two rollers which are supported for movement toward, each other and away from each other as the printed circuit board blank passes through them so that they can apply heat and pressure to a printed circuit board blank without contacting its leading or trailing edges.

Figure 1:
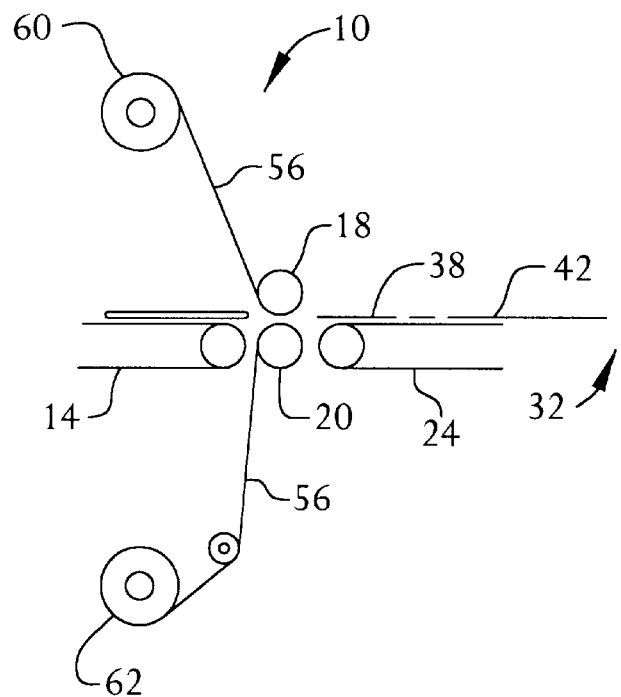
FIG. 1 is a schematic drawing of the apparatus comprising the prior art.

The invention can best be understood by referring to the accompanying drawing wherein a prior art laminating device 10 can be seen to include a feed conveyor 14, upper and lower heated rollers 18 and 20, an exit conveyor 24 and a discharge zone 32.

The conveyors 14 and 24 and the rollers 18 and 24 define a longitudinal path of travel 38 that is generally in a horizontal plane 42.

Preferably, the upper and lower rollers 18 and 20 are comprised of heavy duty solid stainless steel and are coated with 70 durometer rubber on the Shore A hardness scale.

Figure 2:
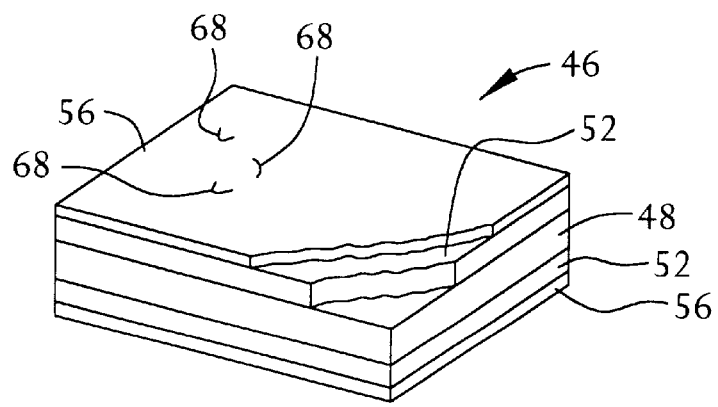
FIG. 2 is a schematic drawing of a laminated printed circuit board blank.

A laminated printed circuit board blank 46 after it leaves the rollers 18 and 24 is illustrated in FIG. 2. It comprises a core 48 of fiberglass resin/mesh between two layers of electrically conductive material 52 such as copper. A layer of photographically light-sensitive material 56 such as an ultra-violet light sensitive film is laminated to each layer of electrically conductive material 52. In some applications only one layer of electrically conductive material 52 and one layer of film is laminated to the core 48. The photographically light-sensitive material 56 is laminated to the layers of electrically conductive material 52 in the laminating device 10.

As seen in FIG. 1, the core 48 with the layers of electrically conductive material 52 are fed into the rollers 18 and 20 by the conveyor 14. If two layers of photographically light-sensitive material 56 are used they may be dispensed from an upper roll 60 and a lower roll 62. The layers are fed between the rollers 18 and 20 where by the application of heat and pressure they are laminated to the surface of the plates of electrically conductive material 52.

However, up to forty percent of the printed circuit board blanks 46 made by the device shown in FIG. 1 are defective in that bubbles 68 or other defects occur during the laminating process where the photographically light sensitive material is not completely bonded to the surface of the plate of electrically conductive material.

Further, many blanks are unusable because during the etching process short circuits, cut circuits, nicked circuits and distortions in the circuit components are created.

Figure 3:
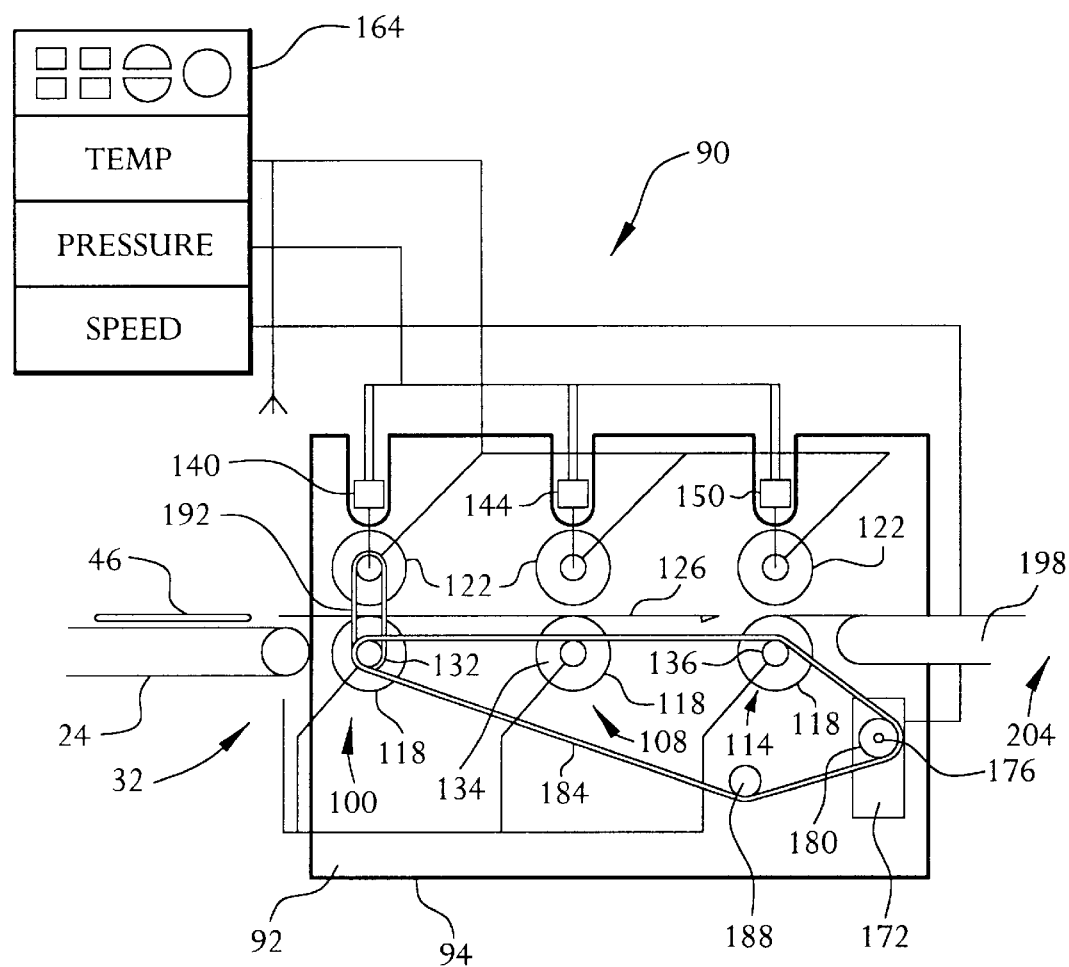
FIG. 3 is a schematic drawing of the apparatus comprising the invention.

The device 90 comprising the invention, as illustrated in FIG. 3, reduces these problems because it includes a plurality of heated pressure rollers along the path of travel of the laminated printed circuit board blank subsequent to its formation in the device 10 and adjacent to the discharge zone 32.

The device 90 includes a frame 92 comprising two spaced side walls 94, only one of which is shown. The side walls 94 support a plurality of sets of rollers 100, 108 and 114. Each set of rollers 100, 108 and 114 comprises a lower roller 118 and an upper roller 122 which are arranged so that their axes of rotation 130 and 132 are in vertical alignment with each other.

The lower rollers 118 define a path of travel 126 for the laminated circuit board blank which may be an extension of the path of travel 38 defined by the rollers 18 and 20 of the laminating device 10.

In this regard, each of the lower rollers 118 is journaled in the frame 92. The distal end of each roller supports a sprocket 132, 134 and 136. The sprockets 132, 134, and 136 and their respective rollers are driven in a manner which will be explained.

Each of the upper rollers 122 is supported in the frame 92 by an actuator 140, 144 and 150. The actuators are preferably pneumatic. However, they could be hydraulic or screw operated.

The actuators 140, 144 and 150 are operative to raise and lower the upper rollers 122 toward and away from the lower rollers 118 in each set rollers 100, 108 and 114 as the printed circuit board blank 46 is moved along the path of travel 126.

The rollers in the sets of rollers 100, 108 and 114 may comprised of heavy duty solid stainless steel and may be coated with 70 durometer rubber on the Shore A hardness scale or of other suitable materials depending on the nature of the materials that are to be laminated.

The actuators 140, 144 and 150 are connected to a suitable programmable logical controller 164 which is operative to control the rotational speed of the lower rollers 118 in each set of rollers 100, 108, 114, their temperature and the energization of the actuators 140, 144 and 150 to apply heat and pressure to the printed circuit board blank 46 to cause the layers of photographically light sensitive material to further bond to the surface of the plates of electrically conductive material.

As seen in FIG. 3, the means for driving the lower rollers 118 comprises a suitable electrically powered motor 172 supported on the frame 92. It includes a laterally extending drive shaft 176 which may support a sprocket 180.

A suitable transmission such as the chain drive 184 is wrapped around sprocket 180 and drive sprockets 130, 132 and 134 which are fixed to each of the lower rollers 118 and idler 188.

Additionally, rollers 118 and 122 in set of rollers 100 may be connected by a chain drive 192 and idler (not shown) so that roller 118 drives roller 132 help to move the printed circuit board blank through the sets of rollers 108 and 114.

Normally, the rollers in each of the sets of rolls 100, 108 and 114 are separated from each other through the force of actuators 140, 144 and 150. As the leading edge of the printed circuit board blank 46 arrives between the rollers in the first set of rolls 100, the programmable logical controller 164 energizes actuator 140 to press the rollers 118 and 122 into engagement with the laminated printed circuit board blank 64. This has the effect of further laminating the layers of ultraviolet photographically sensitive material 56 to the surface of the plates of electrically conductive material 52. This tends to more securely join the layers to each other and to diminish the likelihood of air bubbles or other defects in the printed circuit board blank.

Further, since the rollers in each set of rollers 100, 108 and 114 do not engage the printed circuit board blank until after the leading edge is between them, the leading raw edge of the printed circuit board blank 46 cannot damage the surface of the rollers. In a like manner, the rollers are separated as the trailing edge is about to engage the roller surfaces so that again, the likelihood of damage from the raw trailing edge of the printed circuit board blank is diminished. This is continued through the second set of rollers 108 and third set of rollers 114 until the completed printed circuit board blank leaves the laminating device 90 by way of exit conveyor 198 to a discharge area 204.

Surprisingly, it has been found that the use of a device of the type described, even though it is similar to the heated roller structure in the prior art laminating machine 10, has increased production yields by 1.5% to 3%, and laboratory tests have shown that there is a likelihood that yields could increase up to 10% or more, depending on the nature of the printed circuit board blanks that are made. These numbers are extremely significant in view of the large quantities and high value of printed circuit board blanks made each year.

Further, it has been found that applicant's invention has enjoyed a high degree of acceptance by the printed circuit board manufacturing industry in view of the enormous economic impact of this invention on the manufacture of printed circuit board blanks.

While the invention has been described with respect to one presently preferred form, it is apparent that other forms will be obvious to persons skilled in the art. Further, while the invention has been described with particular attention to the important advantages that it brings to the printed circuit board manufacturing industry it also has utility in other technologies where there are high rejection rates of manufactured laminates due to poor or incomplete bonding of the laminate layers.

Thus, the scope of the invention should not be limited by the preceding description, but rather only by the scope of the following claims.

What is claimed is:

1. In a laminating system for manufacturing a laminated printed circuit board blank where said circuit board blank has a leading edge and a trailing edge, said laminating system being of the type that includes an inlet zone and a discharge zone spaced from each other along a path along which the printed circuit board blank travels as it being laminated, said inlet zone including means for receiving a thin sheet of metal into which the circuit is to be printed and a layer of light sensitive material, a plurality of sets of heated rollers, the rollers in each set being heated and being in selective pressing engagement with each other to press the layer of light sensitive material into close engagement with the thin sheet of metal so that said layer of light sensitive material is bonded to said thin sheet of metal to form a lamination, and said discharge zone is for receiving said laminated circuit board blank, the improvement comprising;

a frame disposed along said path of travel and adjacent to said discharge zone of said laminating device for receiving said laminated printed circuit board blank after it is received in said discharge zone, said frame supporting a plurality of sets of heated rollers, said sets of rollers being disposed longitudinally along the path of travel of said laminated printed circuit board blank, each of said sets of rollers including two rollers, the axes of said rollers in each of said sets being in vertical alignment with respect to each other so that the path of travel through each set of rollers is in the horizontal plane, means interconnected between the rollers on one side of the horizontal plane for driving said rollers on said one side of the horizontal plane in the direction of the path of travel of the laminated printed circuit board blank, means for heating the rollers in each of said sets of rollers, and means for selectively moving the roller in each of said sets on the other side of the horizontal plane vertically toward and way from the roller on said one side of the horizontal plane as said laminated circuit board blank moves through said sets of rollers along said path of travel.

2. In a laminating device for manufacturing a laminated printed circuit board blank of the type described in claim 1 further including a plurality of energizable actuators supported by said frame, each of said energizable actuators having a portion connected to one of said rollers on said other side of the horizontal plane, and means for selectively energizing each of said energizable actuators as the laminated printed circuit board blank moves along said path of travel so that the surfaces of said rollers in each of said set of rollers is spaced from each other until the laminated printed circuit board blank is between them so that the leading edge of said laminated printed circuit. board blank does not damage the surface of the rollers in each of said sets, and the rollers in each of said set of rollers are spaced from each other when the laminated printed circuit board leaves them so that the trailing edge ofsaid laminated printed circuit board blank does not damage the surface of the rollers in each of said sets.

3. In a laminating device for manufacturing a laminated printed circuit board blank of the type described in claim 2 further including each of said rollers on said one side of the horizontal plane includes a laterally extending shaft journaled in said frame, said shafts including a distal end, a plurality of sprockets, each sprocket being fixed to one of said distal ends in driving relation thereto, an energizable power source, a sprocket connected to said power source in driven relation thereto, drive train means connecting said driven sprocket to said driving sprockets so that when said energizable power source is energized, said driving sprockets cause the rollers on said one side of the horizontal plane to rotate about their respective axes.

4. In a laminating device for manufacturing a laminated printed circuit board blank of the type described in claim 3 wherein said drive train includes continuous flexible means.

* * * * *